United States Patent [19]

Kobayashi

[11] Patent Number: 4,818,904
[45] Date of Patent: Apr. 4, 1989

[54] POWER ON RESET PULSE GENERATING CIRCUIT SENSITIVE TO RISE TIME OF THE POWER SUPPLY

[75] Inventor: Toshifumi Kobayashi, Hyogo, Japan
[73] Assignee: Mitsubishi Denki Kabushiki Kaisha, Tokyo, Japan
[21] Appl. No.: 143,398
[22] Filed: Jan. 13, 1988
[30] Foreign Application Priority Data Apr. 1, 1987 [JP] Japan .................. 62-81606

[51] Int. Cl.⁴ .................. H03K 17/22; H03K 17/60
[52] U.S. Cl. .................. 307/594; 307/272.1;
307/601; 307/605; 307/296.5
[58] Field of Search .................. 307/272.3, 272.1, 591,
307/594, 279, 200 B, 601, 603, 605

[56] References Cited

U.S. PATENT DOCUMENTS

| 4,045,688 | 8/1977 | Stewart | 307/360 |
|---|---|---|---|
| 4,210,829 | 7/1980 | Wong et al. | 307/594 |
| 4,581,552 | 4/1986 | Womack et al. | 307/594 |
| 4,591,745 | 5/1986 | Shen | 307/592 |
| 4,634,904 | 1/1987 | Wong | 307/594 |
| 4,716,322 | 12/1987 | D'Arrigo et al. | 307/592 |

FOREIGN PATENT DOCUMENTS 162308 8/1985 Japan .
250715 12/1985 Japan .

Primary Examiner—Stanley D. Miller
Assistant Examiner—Richard Roseen
Attorney, Agent, or Firm—Lowe, Price, LeBlanc, Becker & Shur

[57] ABSTRACT

A power on reset pulse generating circuit, which comprises a flip-flop coupled through capacitors to an applied supply voltage to be resettable thereby, a time constant circuit including an array of diode connecting MOS transistors and a capacitor coupled to reset the flip-flop in response to a fast rise time of an applied supply voltage, and another MOS transistor connected to detect a level of a voltage at the output terminal to reset the flip-flop in response to a slow rise time of the applied supply voltage.

13 Claims, 3 Drawing Sheets

POWER ON RESET PULSE GENERATING CIRCUIT SENSITIVE TO RISE TIME OF THE POWER SUPPLY

BACKGROUND OF THE INVENTION

1. Field of the Invention

The present invention relates to a power on reset pulse generating circuit for initializing a semiconductor integrated circuit when turning the power on.

2. Description of the Prior Art

FIG. 1 is a circuit diagram of a conventional power on reset pulse generating circuit shown in, for example, Japanese Patent Laying-Open Gazette No. 250715/1985. Referring to FIG. 1, numeral 1 denotes a MOS transistor having its drain connected to a node N1, its gate connected to a supply terminal supplying the voltage $V_{CC}$ and its source connected to the ground GND; numeral 2 denotes an inverter having its input connected to the node N1; numeral 3 denotes a waveform shaping circuit (in this example, being formed of two inverters) having its input connected to the output of the inverter 2 and its output connected to a node N2; numeral 4 denotes a MOS transistor having its drain connected to the node N1, its gate connected to the node N2 and its source connected to the ground GND; numeral 5 denotes an inverter having its input connected to the node N2 and outputting a power on reset pulse a to an output terminal T3; numeral 6 denotes a capacitor having one end connected to a supply terminal supplying the voltage $V_{CC}$ and the other end connected to the node N1.

The operation of the circuit will be hereinafter described with reference to FIG. 2 showing the voltage waveform at each portion. As shown in FIG. 2, before turning the power on, $V_{CC}=0$ V ((a) in FIG. 2)) and each node is discharged to 0 V ((b) and (c) in FIG. 2). When the power is turned on at time t0, the potential of the node N1 rises to approximately the supply voltage due to the coupling of the capacitor 6, as shown as (b) in FIG. 2 and then it falls according to the time constant defined by the capacitance of the capacitor 6 and the on resistance of the transistor 1. While the potential of the node N1 is higher than the logical threshold value $V_{TH2}$ of the inverter 2, the node N2 is at the "L" level, the MOS transistor 4 is off and the output terminal T3 is at the "H" level, as shown as (c) in FIG. 2. When the potential of the node N1 becomes lower than $V_{TH2}$ at time t1, the node N2 becomes "H" level, the MOS transistor 4 turns on discharging the node N1 to 0 V and, simultaneously, the output terminal T3 becomes "L" level.

As described above, using the circuit of FIG. 1, a power on reset pulse a ((d) in FIG. 2) having the pulse width determined by the capacitance of the capacitor 6 and the on resistance of the MOS transistor 1 can be generated after turning the power on.

In the conventional power on reset pulse generating circuit structured as above, a sufficient level of the power on reset pulse a can not be obtained in case where the supply voltage rises very slowly, as shown by the waveform in FIG. 3. This problem will be described with reference to FIG. 3.

If the supply voltage $V_{CC}$ rises slowly from the time t2 (as (a) in FIG. 3), the node N1 also rises slowly corresponding to the supply voltage $V_{CC}$ (as (b) in FIG. 3). If the time constant of the supply voltage rise is larger than the above described time constant defining the pulse width of the power on reset pulse, the potential of the node N1 begins to fall from the time when $V_{CC}$ exceeds the threshold value $V_{TH1}$ of the MOS transistor 1 and it becomes lower than the logical threshold value $V_{TH2}$ of the inverter 2 at the time t3, where the node N2 becomes "H" level (as (c) in FIG. 3), and the potential of the node N1 is discharged to 0 V. On this occasion, the reset pulse a as (d) in FIG. 3 is held at the "H" level until the time t3. However, if $V_{CC}$ does not sufficiently rise at the time t3, the "H" level of the reset pulse a is low since the "H" level potential of the reset pulse a is approximately the same as the supply voltage, with the result of a possibility that a pulse necessary for initializing other circuits cannot be obtained.

Another prior art, U.S. Ser. No. 571,028 now U.S. Pat. No. 4,591,745 entitled "Power On Reset Pulse Generating Device", filed on Jan. 16th, 1984 discloses a circuit for generating a reset pulse formed on a chip of a CMOS integrated circuit which can be manufactured according to a conventional manner.

SUMMARY OF THE INVENTION

Accordingly, a principal object of the present invention is to provide a power on reset pulse generating circuit for providing a reset signal at an output terminal thereof, which reset signal is immune to a difference in the rise time of an applied supply voltage.

Another object of the present invention is to provide a power on reset pulse generating circuit for providing a reset signal at an output terminal thereof in a stable manner in response to an applied supply voltage having a fast rise time and an applied supply voltage having a slow rise time.

Briefly described, the present invention comprises a power on reset pulse generating circuit for providing a reset signal at an output terminal thereof, comprising: latch means settable into a first state and resettable into a second state; means for setting the latch means in response to an applied supply voltage; first resetting means including time constant circuit means for resetting the latch means in response to an applied supply voltage having a fast rise time; and second resetting means including level detecting means for resetting the latch means in response to an applied supply voltage having a slow rise time.

According to the present invention, an applied supply voltage is first detected and the latch means is set into a first state in response to the applied supply voltage. Then the latch means is reset into a second state in response to a fast rise time of the applied supply voltage by the use of the time constant means coupled to the output terminal, or the latch means is reset into a second state in response to a slow rise time of the applied supply voltage by the use of the voltage level detecting means coupled to the output terminal. As a result, a reset signal is provided in a stable manner irrespective of the rise time of an applied supply voltage.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 5 and 6 are diagrams of waveforms illustrating the operation of the circuit of FIG. 4.

DESCRIPTION OF THE PREFERRED EMBODIMENTS

Figure 1:
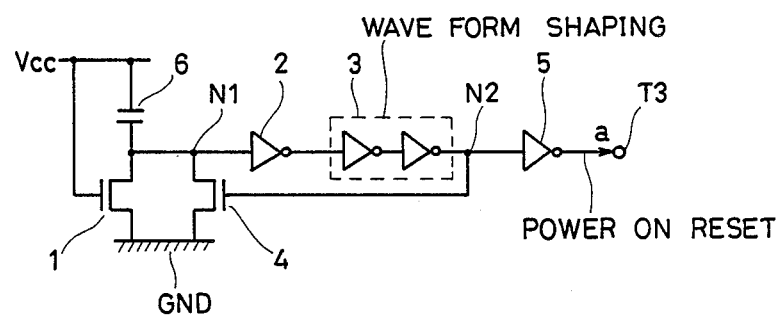
FIG. 1 is a schematic diagram of a conventional power on reset pulse circuit.
Figure 2:
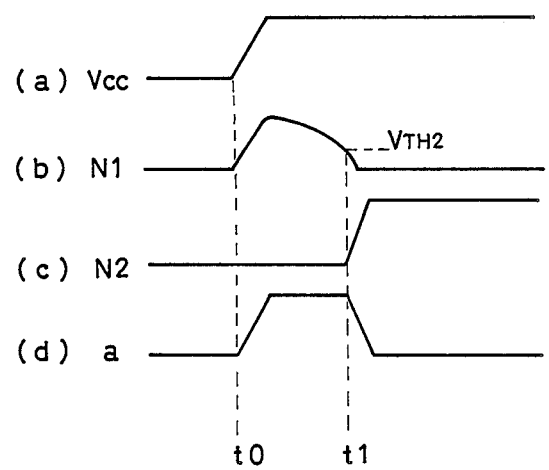
FIGS. 2 and 3 are diagrams of waveforms illustrating the operation of the circuit of FIG. 1.
Figure 3:
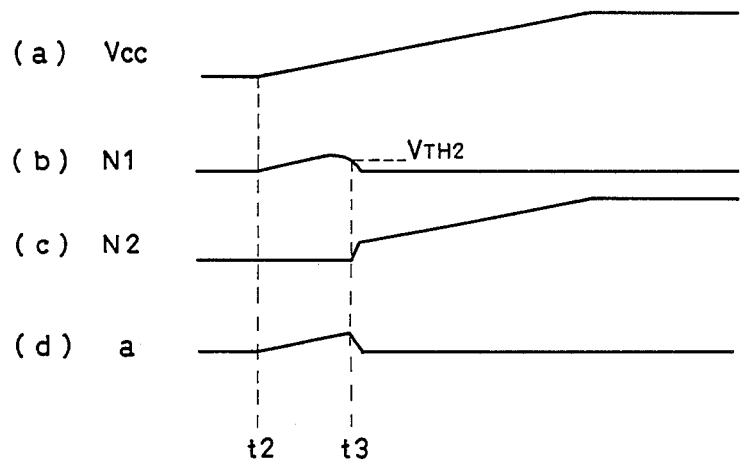
Figure 4:
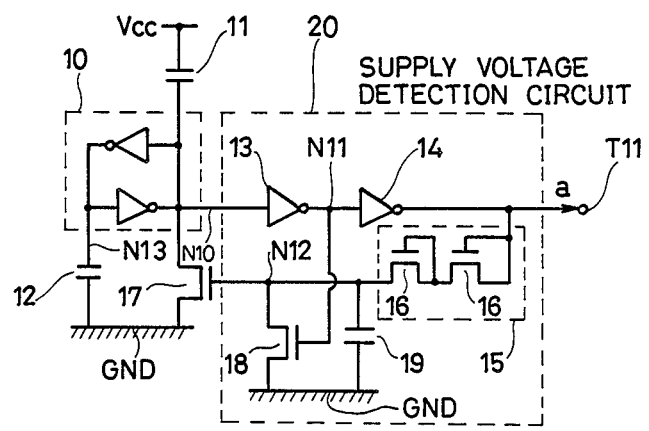
FIG. 4 is a schematic diagram of one embodiment of the power on reset pulse generating circuit according to the present invention.

FIG. 4 is a circuit diagram of one embodiment of power on reset pulse generating circuit according to the present invention. As shown in the figure, numeral 10 denotes a flip-flop (in this embodiment, being formed of two inverters) having one output terminal connected to a node N10 and the other output terminal connected to a node N13; numeral 11 denotes a capacitor having one end connected to a supply terminal supplying the voltage $V_{CC}$ and the other end connected to the node N10; numeral 12 denotes a capacitor having one end connected to the node N13 and the other end connected to the ground GND; numeral 13 denotes a first inverter having its input connected to the node N10; numeral 14 denotes a second inverter having its input connected to a node N11 which is the output point of the first inverter 13 and outputting the power on reset pulse a to an output terminal T11; numeral 15 denotes a MOS diode array of two MOS diodes 16 connected in series in which the MOS diodes 16 are composed of MOS transistors having its drain and gate connected together. In the MOS diode array 15, the drain and gate connection side terminal is connected to the output of the inverter 14 and the source side terminal is connected to the node N12. Numeral 17 denotes a first MOS transistor having its drain connected to the node N10, its gate connected to the node N12 and its source connected to the ground GND; numeral 18 denotes a second MOS transistor having its drain connected to the node N12, its gate connected to the node N11 and its source connected to the ground GND; numeral 19 denotes a capacitor having its one end connected to the node N12 and the other end connected to the ground GND; numeral 20 denotes a supply voltage detection circuit comprising the inverters 13, 14, the MOS diode array 15, the MOS transistor 18 and the capacitor 19.

The operation will be hereinafter described with reference to the waveforms shown in FIGS. 5 and 6. FIG. 5 illustrates the waveforms depicting operation in which the supply voltage rises rapidly. In FIG. 5, each of the nodes is discharged to 0 V before turning the power on. When the power is turned on at the time t10 (as (a) in FIG. 5), the node N10 begins to rise to the supply voltage (as (b) in FIG. 5) due to the coupling of the capacitor 11, since the MOS transistor 17 is off. On the contrary, the node N13 tends to remain at 0V, so that the flip-flop 10 is set in that direction in which the node N10 becomes "H" level. On this occasion, the node N11 is at the "L" level (as (c) in FIG. 5), the MOS transistor 18 is off, the power on reset pulse a which is an output signal of the inverter 14 becomes "H" level (as (d) in FIG. 5) and begins to charge the node N12 through the MOS diode array 15 (as (e) in FIG. 5). When the potential of the node N12 exceeds the threshold value $V_{TH17}$ of the MOS transistor 17 at the time t11, the MOS transistor 17 turns on, lowering the potential of the node N10 to reset the flip-flop 10, and the node N11 becomes "H" level and the reset pulse a becomes "L" level. Meanwhile, the MOS transistor 18 turns on and the node N12 discharges. In this case the pulse width of reset pulse a is determined by the threshold value of the MOS transistor 17, the output characteristic of the inverter 14 and the time constant defined by the on-resistance of the MOS diode array 15 and the capacitance of the capacitor 19.

FIG. 6 is a waveform diagram depicting the operation in which the supply voltage rises very slowly. Referring to the figure, when the power is turned on at the time t12 (as (a) in FIG. 6), the flip-flop 10 is set in the same direction as in the case of FIG. 5 (as (b) in FIG. 6), the node N11 becomes "L" level (as (c) in FIG. 6) and the power on reset pulse a becomes "H" level (as (d) in FIG. 6). Thereafter the supply voltage gradually rises and, from the time when the "H" level of the reset pulse a (approximately equal to the supply voltage $V_{CC}$) exceeds the threshold value $V_{TH15}$ of the MOS diode array (in this embodiment, twice the threshold value $V_{TH16}$ of the MOs Transistor 16) charging of the node N12 begins (as (e) in FIG. 6). When that potential exceeds the threshold value $V_{TH17}$ of the MOS transistor 17 at the time t13, the reset pulse a becomes "L" level as in the case of FIG. 5 and the node N12 is discharged. In this case, the reset pulse a surely maintains the "H" level of about $V_{TH16} + V_{TH17}$.

Although the MOS diodes connected in series in two stages are used for the diode array of the supply voltage detection circuit 20 in the above embodiment, a PN junction diode may be used and, the number of stages may not be limited to two, provided that the threshold value of the diode array is approximately equal to the lowest level required for the power on reset pulse a. In addition, although the pulse generated at the node N10 is outputted as the reset pulse a through the inverters 13 and 14 which function as means for waveform shaping, the pulse generated at the node N10 may directly be the reset pulse a depending on the load condition.

As described above, the present invention comprises a flip-flop set in response to the application of the supply voltage and a supply voltage detecting circuit which detects the rise of the supply voltage exceeding a prescribed potential and outputs a signal and, when the power is turned on, a power on reset pulse for initializing other circuits integrated on the same chip is obtained from the output of the flip-flop or from the waveform shaped output of said output, whereby the "H" level of the power on reset pulse can be enhanced by a value associated with the threshold value of the diode array forming the supply voltage detecting circuit, providing a stable power on reset pulse independent of the rise time of the supply voltage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A power on reset pulse generating circuit for providing a reset signal at an output terminal thereof, comprising:

latch means settable into a first state and resettable into a second state, means for setting said latch means in response to an applied supply voltage, first resetting means including time constant circuit means for resetting said latch means in response to an applied supply voltage having a fast rise time, and second resetting means including level detecting means for resetting said latch means in response to an applied supply voltage having a slow rise time.

2. A power on reset pulse generating circuit in accordance with claim 1, wherein said latch means comprises cross coupled inverters.

3. A power on reset pulse generating circuit in accordance with claim 1, wherein said setting means comprises first capacitor means connected between said latch means and a source of said applied supply voltage.

4. A power on reset pulse generating circuit in accordance with claim 3, wherein said setting means includes second capacitor means connected between said latch means and a ground.

5. A power on reset pulse generating circuit in accordance with claim 1, wherein said first resetting means comprises resistance means and third capacitor means coupled between said output terminal and a ground.

6. A power on reset pulse generating circuit in accordance with claim 5, wherein said resistance means comprises MOS transistor means.

7. A power on reset pulse generating circuit in accordance with claim 6, wherein said MOS transistor means comprises a plurality of MOS transistors connected in series with each other.

8. A power on reset pulse generating circuit in accordance with claim 1, wherein said second resetting means comprises level detecting means for detecting a level of a voltage at said output terminal.

9. A power on reset pulse generating circuit in accordance with claim 8, wherein said level detecting means comprises
first transistor means connected between said latch means and a ground, and
constant voltage dropping means connected between said output terminal and said first transistor means.

10. A power on reset pulse generating circuit in accordance with claim 9, wherein said constant voltage dropping means comprises diode connected MOS transistor means.

11. A power on reset pulse generating circuit in accordance with claim 1, wherein said time constant circuit means of said second resetting means includes a capacitor, said reset pulse generating circuit further including means responsive to the reset state of said latch means for discharging said capacitor.

12. A power on reset pulse generating circuit in accordance with claim 1, which further includes resettable circuit means reset in response to said reset signal, said resettable circuit means and said power on reset pulse generating circuit being integrated on a common chip.

13. A method of providing a power on reset pulse at an output terminal, comprising the steps of detecting an applied supply voltage,
setting latch means in a first state in response to said applied supply voltage,
using time constant circuit means coupled to said output terminal for resetting said latch means in a second state in response to a fast rise time of said applied supply voltage, and
using voltage level detecting means coupled to said output terminal for resetting said latch means into said second state in response to a slow rise time of said applied supply voltage.

* * * * *